(12) United States Patent
Corkum et al.

(10) Patent No.: US 6,765,391 B2
(45) Date of Patent: Jul. 20, 2004

(54) LOW COST ASIC ARCHITECTURE FOR SAFETY CRITICAL APPLICATIONS MONITORING AN APPLIED STIMULUS

(75) Inventors: David L. Corkum, Attleboro, MA (US); Keith W. Kawate, Attleboro Falls, MA (US); Thomas R. Maher, Rehoboth, MA (US)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 10/277,797

(22) Filed: Oct. 22, 2002

(65) Prior Publication Data

US 2004/0075447 A1 Apr. 22, 2004

(51) Int. Cl.[7] .................. G01R 27/02; G01R 27/32
(52) U.S. Cl. .................. 324/610; 324/725; 324/648; 324/706
(58) Field of Search .................. 324/207.19, 526, 324/610, 648, 657, 666, 680, 706, 725, 88, 101, 601; 73/1.11, 1.01, 1.15, 1.88, 763, 862.628; 702/88, 104, 107, 117

(56) References Cited

U.S. PATENT DOCUMENTS

| | | | |
|---|---|---|---|
| 5,770,802 A | 6/1998 | Berthold et al. | ............ 73/765 |
| 6,304,074 B1 * | 10/2001 | Waffenschmidt | ............ 324/202 |
| 6,433,554 B1 * | 8/2002 | Kawate et al. | ............ 324/500 |
| 2002/0047716 A1 * | 4/2002 | Maher et al. | ............ 324/706 |

* cited by examiner

Primary Examiner—N. Le
Assistant Examiner—Donald M. Lair
(74) Attorney, Agent, or Firm—Russell E. Baumann; Frederick J. Telecky, Jr.

(57) ABSTRACT

An ASIC (14, 14', 14") conditions two independent outputs (VINM, VINP) of a full Wheatstone piezoresistive bridge (12) in separate conditioning paths. Each path is provided with a bridge supply voltage (VHB1, VHB2) which can serve as a temperature related input signal to respective offset and gain compensation control circuits. The half bridge outputs are inputted to respective amplifiers (U1, U2) along with a selected percentage of the temperature dependent bridge supply voltage. The outputs of the amplifiers provide a signal proportional to respective half bridge output voltage. In one embodiment, the output of the amplifier (U2) in one conditioning path of one half bridge is connected to the input of an amplifier (U4) in the other conditioning path to provide a signal in the one path proportional to the Wheatstone bridge differential output voltage and in the other path a signal proportional to the Wheatstone half bridge output voltage. In another embodiment, the temperature dependent bridge supply voltage is multiplexed for a selected time upon power-up to an amplifier (U5) which normally receives an input from one of the bridge outputs.

8 Claims, 3 Drawing Sheets

LOW COST ASIC ARCHITECTURE FOR SAFETY CRITICAL APPLICATIONS MONITORING AN APPLIED STIMULUS

FIELD OF THE INVENTION

The invention relates generally to Wheatstone bridge circuits used in sensors for monitoring an applied stimulus such as pressure, force, acceleration and the like in automotive safety critical applications and more particularly to ASICs (application specific integrated circuits) having a simple architecture to enable low cost sensors for such applications.

BACKGROUND OF THE INVENTION

A sensor of the type described herein is used, for example, in an automotive application for monitoring an applied stimulus, such as brake fluid pressure, force, acceleration and the like and, as in the case of a pressure sensing application, typically comprise a sense element to provide a Wheatstone bridge signal in response to a target stimulus. By way of example, a pressure sensing sense element can be comprised of four piezoresistors bonded to a diaphragm having appropriate interconnectivity and diaphragm placement. The sensor typically includes a sense element, a circuit (e.g., ASIC) which amplifies and compensates that signal which then is typically inputted through a wiring harness or the like into an analog to digital converter of an Electronic Control Unit (ECU), for example, for further processing.

Many safety critical applications such as automotive electro-hydraulic braking, brake assist, inertial stability systems having braking control and the like, depend on the validity of in-range sensor signals. In-range sensor signals are signals within the normal range of output signals over all application tolerances and stimulus range limits. Conventionally, safety critical systems have relied on having two sensors with agreement of the sensor signals providing assurance of the validity of the signals. Although this approach provides suitable assurance of signal validity, it is a costly solution requiring an extra sensor, wire harness and connector.

Another approach has been to add extensive diagnostic circuits in the sensor's ASIC to provide a higher degree of reliability for in-range sensor outputs compared to a similar single sensor not having such diagnostic circuits. This approach provides a cost savings over the two sensor approach, however, this approach requires the use of extensive ASIC die area thereby adversely impacting the sensor's cost, complicates the calibration algorithm and does not guarantee signal validity for signals in the active range for all plausible fault conditions. For example, the single output format of such a sensor does not detect relatively high occurrence failure modes which can invalidate in-range output signals. By way of example, such failures could occur due to an electrically damaged output stage or excessive connector resistance developed during long driving periods of an automobile having such a sensor.

SUMMARY OF THE INVENTION

It is an object of the invention to provide a conditioning circuit useful in an ASIC which overcomes the limitations of the prior art mentioned above. Another object is the provision of a simple, low cost conditioning circuit useful with a sensor comprising a Wheatstone bridge having piezoresistive bridge elements which enables improved diagnosis of the sensor signal. Yet another object is the provision of such a circuit which can provide a temperature output, or redundant temperature outputs at selected times such as during a start-up phase of the sensor.

Briefly in accordance with the invention, a Wheatstone bridge circuit having applied stimulus sensitive piezoresistive bridge elements comprises independent signal conditioning paths for each half bridge. Each half bridge is connected between an independent temperature dependent bridge supply voltage and ground. The output of each half bridge is connected to one input of a respective amplifier and a selected proportion of the temperature dependent bridge supply voltage is connected to a second input of the respective amplifier.

The temperature dependent Wheatstone half bridge supply voltages are also inputted to respective offset and gain compensation control circuits which provide temperature compensation of the transfer function of the amplifiers. The outputs of the half bridges are a pair of voltage output signals which are mutually proportional to the supply voltages and stimulus. The two half bridge outputs have nominally equal stimulus sensitivities of opposite sign.

According to one embodiment, the output of the first amplifier connected to the first half bridge is connected to one of two inputs of a third amplifier with the other input of the third amplifier receiving the output of the second amplifier connected to the output of the second half bridge. The output of the second amplifier is also connected to the single input of a fourth amplifier so that the output of the third amplifier provides a signal proportional to the Wheatstone bridge differential output voltage and the output of the fourth amplifier provides a signal proportional to the Wheatstone half bridge output voltage.

According to a second embodiment, the output of each half bridge is connected to the single input of an amplifier having a fixed functional relationship to provide two output signals, each proportional to a respective Wheatstone half bridge output voltage.

According to yet another embodiment, the temperature dependent voltage signal and the signal proportional to the Wheatstone half bridge output voltage are multiplexed to the single input of an output amplifier under the control of a state machine, or the like, to provide a temperature dependent signal on an output node of the ASIC for a selected time period followed by the signal proportional to the Wheatstone half bridge output on the same output node on a continuous basis after the expiry of the time period.

The above embodiments enable detection of plausible sensor or sensor interconnectivity flaws from the sensor's sense element to the ECU (electronic control unit) input signal measurement circuit in a robust yet simple manner enabling the provision of an improved low cost sensor.

BRIEF DESCRIPTION OF THE DRAWINGS

Other objects, advantages and details of the novel and improved Wheatstone bridge conditioning circuit of the invention appear in the following detailed description of preferred embodiments of the invention, the detailed description referring to the drawings in which.

DETAILED DESCRIPTION OF PREFERRED EMBODIMENTS

Figure 1:
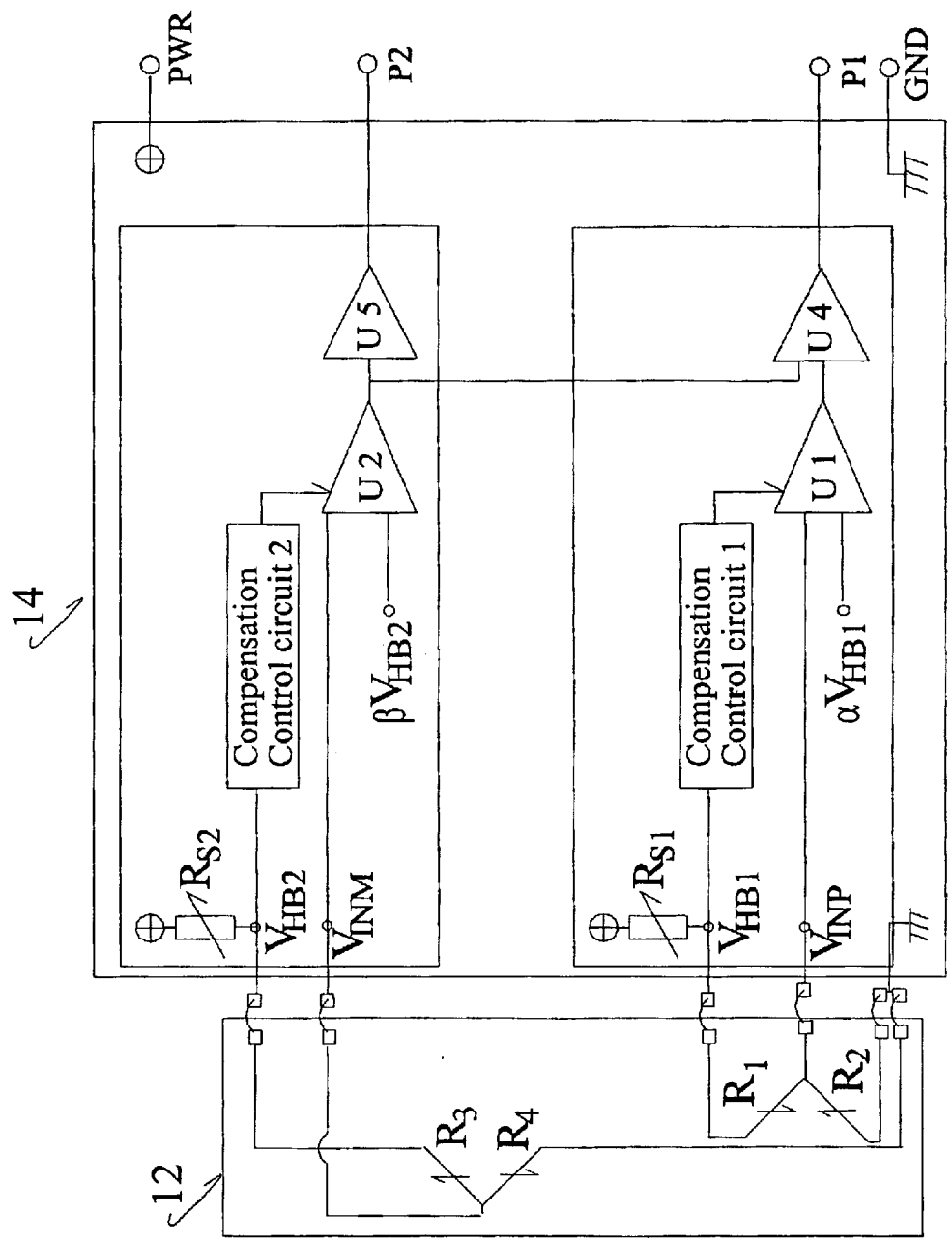
FIG. 1 is a schematic diagram of a Wheatstone bridge connected to an ASIC made in accordance with a first preferred embodiment of the invention.

With reference to FIG. 1, a full Wheatstone piezoresistive bridge 12 of such a sense element comprises piezoresistors R1 and R2 of one half bridge and piezoresistors R3 and R4 of another half bridge connected separately to five distinct nodes of an integrated circuit (IC) 14. Resistors R1 and R2 are connected to the integrated circuit ground GND and supplied by a half bridge voltage supply VHB1 through a series resistance RS1. The output of the half bridge composed of R1 and R2 serves as an input to the integrated circuit VINP node. Half bridge voltage supply VHB1 preferably is made to be dependent on temperature, specifically the temperature of half bridge R1, R2 by selecting the temperature coefficient of resistance of resistor RS1 to be roughly equal to zero, or at least to be insignificant when compared to the temperature coefficient of resistance of the sum of the resistances of resistors R1, R2. With this arrangement, the temperature dependence of the voltage signal VHB1 can serve as an input to IC 14 to provide an indication of the half bridge piezoresistor temperature. The signal VHB1 serves as an input to compensation control circuit 1 to provide temperature dependent compensation of the transfer function of amplifier U1. Amplifier U1 has inputs VINP and a VHB1. Alpha is a proportionality constant roughly equal to 0.5. The output of amplifier U1 is a signal that is generally independent of temperature due to the corrections of compensation control circuit 1 for a fixed input stimulus, e.g., pressure, force and the like. Thus, the output signal of U1 is generally linear with applied stimulus assuming a linear variation of input signal VINP with stimulus.

Similarly, the second bridge half comprising resistors R3 and R4 are connected to IC ground GND and supplied by a half bridge voltage supply VHB2 through a series resistor RS2. The output of the half bridge composed of R3 and R4 serves as an input to the IC VINM node. The half bridge voltage supply VHB2 preferably is made to be dependent on temperature by selecting the temperature coefficient of resistance of resistor RS2 to be roughly equal to zero, or at least to be insignificant, compared to the temperature coefficient of resistance of the sum of the resistances of resistors R3, R4. The signal VHB2 serves as an input to compensation control circuit 2 providing temperature dependent compensation of the transfer function of amplifier U2 having inputs VINM and β VHB2. Beta is a proportionality constant also roughly equal to 0.5. Thus, the output of amplifier U2 is a signal proportional to applied stimulus generally independent of temperature due to the corrections of compensation control circuit 2 roughly equal to and of opposite slope of the output of amplifier U1.

The output of amplifier U2 is connected both to amplifier U5 having a fixed functional relation providing drive capability and additional gain to achieve the desired transfer function between stimulus and output voltage signal and to one of two inputs of amplifier U4 whose other input is connected to the output of amplifier U1 of the first half bridge. Amplifier U4 has a voltage gain roughly half as large as amplifier U5. Output signal P2 of amplifier U5 is proportional to output of amplifier U2, while output signal P1 of amplifier U4 is proportional to the difference between the output of amplifier U2 and the output of amplifier U1, a signal related to the difference between the half bridge output voltages. The output signal P1 has a generally equal and opposite slope to that of output signal P2 versus applied stimulus. This enables the diagnosis by an ECU or the like of a variety of faults which can occur either in the integrated circuit or in either half bridge that would cause a change in one or both of the output signals. Although the described circuit provides voltage output signals, it is within the purview of this invention to provide various other output formats such as electrical current, pulse width modulated voltage, digital voltage or current, etc.

Figure 2:
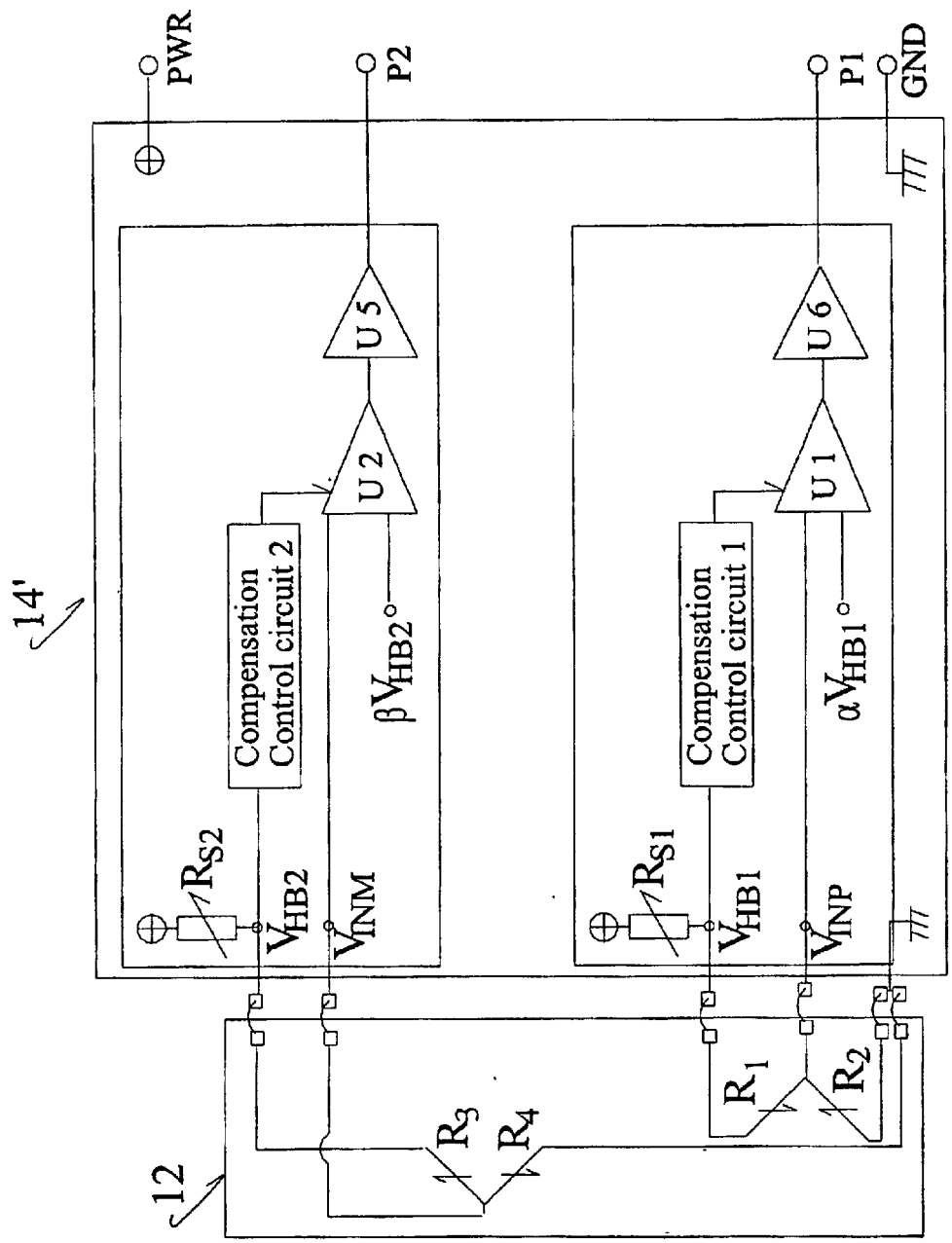
FIGS. 2 and 3 are schematic diagrams similar to FIG. 1 according to alternative preferred embodiments.

A second embodiment is shown in FIG. 2. The piezoresistive bridge 12, voltage supplies VHB1, VHB2, compensation circuits 1 and 2, amplifiers U1 and U2 and proportionality constants alpha and beta of IC 14' are the same as in the FIG. 1 embodiment and need not be re-described. However, amplifier U6, similar to amplifier U5, has a fixed functional relationship and has a gain corresponding to that of amplifier U5.

The FIG. 2 embodiment results in a somewhat simpler circuit architecture since an additional small diagnostic circuit (not shown) would normally be included in the FIG. 1 embodiment to provide a detection capability for known sensor failures capable of producing outputs that appear as valid signals at or near the maximum limits of the sensing range. Although the FIG. 1 circuit results in slightly lower noise in output signal P1 due to the lower gain required for amplifier U4, the circuit of FIG. 2 avoids the FIG. 1 gap in diagnostic coverage by generating two signals that are both functionally related to half bridge signals. Further, it has been found that the P2 signal has generally the same accuracy as the P1 signal thereby providing more robust diagnostic coverage.

Figure 3:
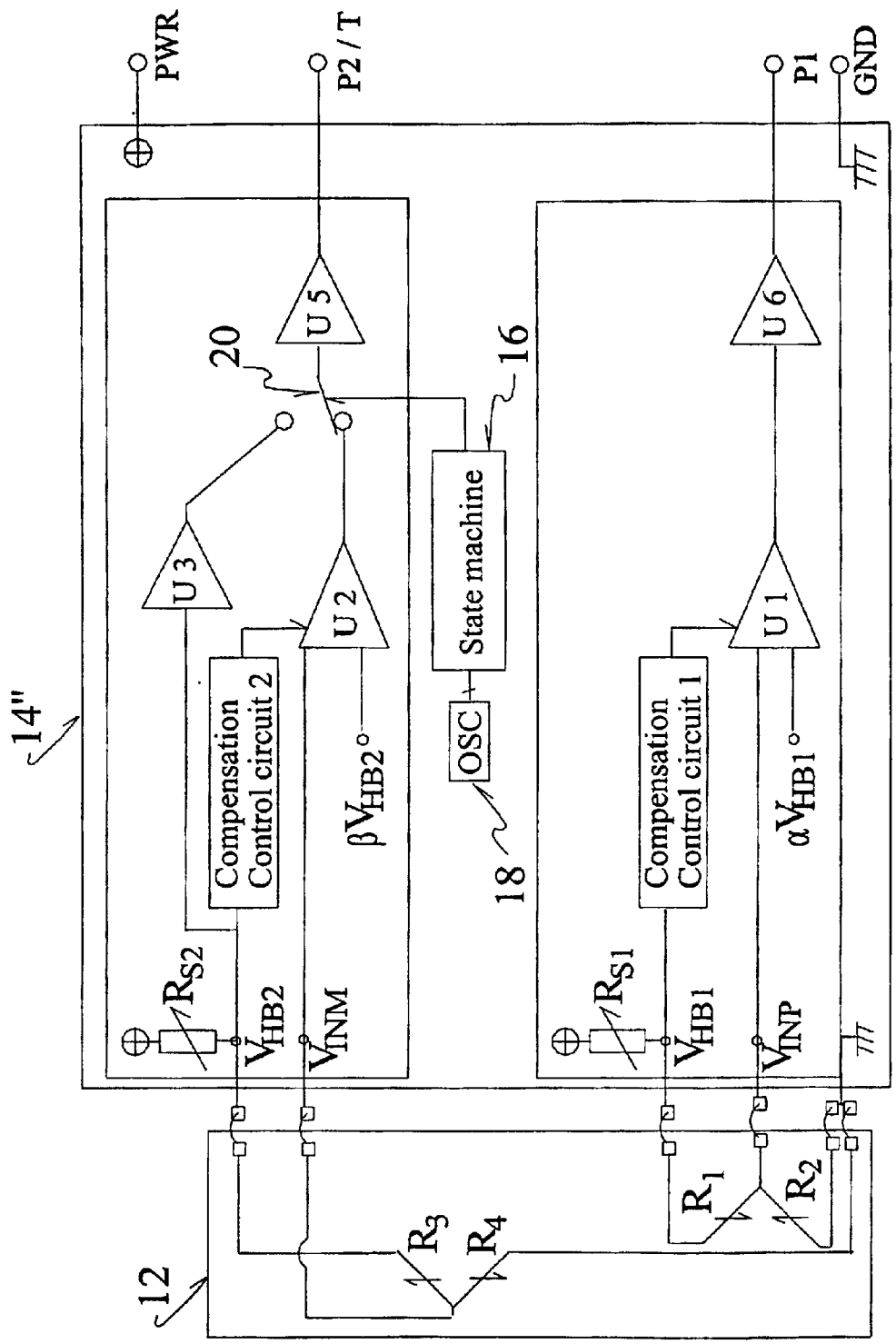

FIG. 3 shows a modification of the FIG. 2 embodiment. The FIG. 3 embodiment provides fault diagnostics in which two signals P1 and P2 of P2/T are compared to determine the validity of the indicated stimulus, e.g., pressure as well as providing a second signal on the P2/T node controllable by a system or a user command. The circuit of IC 14" provides an output proportional to the sense element half bridge voltage on the P2/T node for a selected fixed period of time prior to reverting to constant P2 signals on the P2/T node. Careful control of design and manufacturing parameters such as piezoresistor impurity doping concentration, diaphragm's temperature coefficient of thermal expansion, sensor calibration temperature, etc., can yield a substantially linear half bridge voltage change versus sense element temperature. Bridge 12 of FIG. 3 is the same as described above with reference to the FIGS. 1 and 2 embodiments. IC 14" of the FIG. 3 embodiment adds to the FIG. 2 circuit amplifier U3 having an input connected to half bridge voltage supply VHB2 and whose output is switchable to the input of amplifier U5 under the control of a state machine 16 and oscillator 18 for time multiplexing the P2/T node through switch 20. Thus a selected logical progression is followed by the state machine to provide a signal on the P2/T node proportional to sense element temperature at selected times which are not critical to the monitoring of the primary stimulus. That is, this additional operation is based on the particular safety critical monitoring of a primary stimulus, such as information on pressure in an automotive braking application, when such information and the diagnostic coverage can be interrupted for a brief period of time to shut down the power, turn the power back on to yield the temperature signal for a brief period of time before reverting back to the safety critical monitoring operation. In the braking example mentioned above, one suitable time could be when the automobile is stationary, as in start-up, so that monitoring of the hydraulic fluid could be interrupted without a concern of having unsafe conditions during a braking operation.

The embodiments of FIGS. 1–3 typically would be used with a suitable electronic control unit (ECU) of an automobile or the like. As described above, each half of the sensor signal is compensated for offset and span over temperature in compensation circuits 1, 2 yielding a generally constant linear relationship with applied stimulus over a wide temperature range. These signals that are supply ratiometric and stimulus ratiometric typically are then converted to a digital signal and mathematically matched to a model in the ECU.

It should be understood that although particular embodiments of the invention have been described by way of illustrating the invention, other embodiments and variations of the invention are possible. It is intended that the invention include all modifications and equivalents of the disclosed embodiments falling within the scope of the claims.

What is claimed:

1. A Wheatstone bridge conditioning circuit comprising
first and second half bridges and an integrated circuit having an integrated circuit power supply, first and second half bridge power supply nodes connected to at least one power supply for providing first and second half bridge power supplies, first and second integrated circuit half bridge input nodes and at least one ground node,
the first half bridge having first and second stimulus responsive bridge elements serially connected between the first half bridge power supply node and a ground node and having a first half bridge output at the junction between the first and second bridge elements which is connected to the first integrated circuit half bridge input node and the second half bridge having third and fourth stimulus responsive bridge elements serially connected between the second half bridge power supply node and a ground node and having a second half bridge output at the junction between the third and fourth bridge elements which is connected to is the second integrated circuit half bridge input node,
first and second offset and gain compensation control circuits,
first and second amplifiers each having two inputs and an output, the integrated circuit first and second half bridge input nodes connected respectively to one input of the first and second amplifiers and the second amplifier inputs of the first and second amplifiers connected to voltage signals proportional to voltages of first and second half bridge power supplies respectively,
the output of the first and second compensation control circuits connected respectively to the first and second amplifiers, the output of the first and second amplifiers each having an output signal proportional to respective first and second Wheatstone half bridge output voltages with each amplifier output signal having offset and gain adjustment to an applied stimulus.

2. A Wheatstone bridge conditioning circuit according to claim 1 in which the half bridge power supplies are voltage supplies.

3. A Wheatstone bridge conditioning circuit according to claim 2 in which the integrated circuit power supply is a substantially fixed voltage supply source and the first and second half bridge power supplies are serially connected through respective first and second resistors to the integrated circuit power supply.

4. A Wheatstone bridge conditioning circuit according to claim 2 in which the first and second offset and gain compensation circuits are controlled by the voltages of the first and second half bridge power supplies respectively.

5. A Wheatstone bridge conditioning circuit according to claim 2 in which the bridge elements are piezoresistors.

6. A Wheatstone bridge conditioning circuit according to claim 5 further comprising third and fourth amplifiers, the third amplifier having first and second inputs and an output and the fourth amplifier having a single input and an output, the output of the second amplifier connected to a first input of the third amplifier and to the input of the fourth amplifier and the output of the first amplifier connected to the second input of the third amplifier, the outputs of the third amplifier providing a signal proportional to the Wheatstone bridge differential output voltage and the output of the fourth amplifier providing a signal proportional to the Wheatstone half bridge output voltages, each output signal having offset and gain adjustment to an applied stimulus.

7. A Wheatstone bridge conditioning circuit according to claim 5 further comprising third and fourth amplifiers each having a single input and an output, the outputs of the first and second amplifiers respectively connected to the inputs of the third and fourth amplifiers providing output signals proportional to each respective Wheatstone half bridge output voltage, each output signal having offset and gain adjustment to an applied stimulus.

8. A Wheatstone bridge conditioning circuit according to claim 5 further comprising third, fourth and fifth amplifiers, the third, fourth and fifth amplifiers having a single input and an output, the output of the first amplifier connected to the input of the third amplifier,
a multiplexing switch and a state machine, the multiplexing switch having an output connected to the input of the fourth amplifier and an input movable between the outputs of the second and fifth amplifiers under the control of the state machine, the input of the fifth amplifier connected to a temperature dependent half bridge voltage supply signal in which the output of the fourth amplifier provides an output signal proportional to the temperature dependent voltage supply for a selected time following the application of power to the conditioning circuit followed by a continuous output signal proportional to at least one Wheatstone half bridge output voltage.

* * * * *